US009666248B1

(12) United States Patent
Peterson

(10) Patent No.: US 9,666,248 B1
(45) Date of Patent: May 30, 2017

(54) SECURE CONFIGURATION READBACK FOR PROGRAMMABLE LOGIC DEVICES

(71) Applicant: Xilinx, Inc., San Jose, CA (US)

(72) Inventor: Edward S. Peterson, Gilbert, AZ (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/885,709

(22) Filed: Oct. 16, 2015

(51) Int. Cl.
*G11C 16/04* (2006.01)
*G11C 7/10* (2006.01)
*G11C 7/24* (2006.01)
*G11C 16/22* (2006.01)
*G11C 16/10* (2006.01)

(52) U.S. Cl.
CPC ............ *G11C 7/10* (2013.01); *G11C 7/24* (2013.01); *G11C 16/10* (2013.01); *G11C 16/22* (2013.01); *G11C 16/0433* (2013.01)

(58) Field of Classification Search
CPC .... G11C 7/10; G11C 7/12; G11C 7/16; G11C 7/22; G11C 7/24; G11C 7/1051; G11C 16/0433

USPC .......... 365/185.04, 185.05, 189.011, 189.15, 365/189.17, 189.19
See application file for complete search history.

(56) References Cited

U.S. PATENT DOCUMENTS

| 6,992,503 | B2* | 1/2006 | Madurawe | .......... G06F 17/5045 326/39 |
| 7,205,589 | B2* | 4/2007 | Madurawe | .......... G06F 17/5045 257/209 |
| 7,627,848 | B2* | 12/2009 | Madurawe | .......... G06F 17/5045 716/138 |
| 2013/0311961 | A1* | 11/2013 | Madurawe | .......... G06F 17/5045 716/103 |

* cited by examiner

Primary Examiner — Gene Auduong
(74) Attorney, Agent, or Firm — Frederick Hsu; LeRoy D. Maunu

(57) ABSTRACT

A programmable integrated circuit, includes an external port, a configuration memory, a hardened write path between the external port and the configuration memory and a soft read path between the configuration memory and the external port, wherein configuration data stored in the configuration memory is only read through the soft read path.

20 Claims, 9 Drawing Sheets

SECURE CONFIGURATION READBACK FOR PROGRAMMABLE LOGIC DEVICES

FIELD OF THE INVENTION

This disclosure relates generally relates to configuration readback for programmable logic devices, and in particular to a mechanism for secure configuration readback for programmable logic devices.

BACKGROUND

Programmable circuit devices include several programmable circuit elements that may be configured to perform various different functions. Such programmable circuit devices may be configured by a user to fulfill his particular application.

In general, the functionality of a programmable circuitry is not established until configuration data is loaded into a configuration memory of the IC. Typically, an encrypted configuration bitstream is loaded into the programmable device, where it is decrypted and stored in the configuration memory of the programmable device. The unencrypted configuration bitstream may then be used to program programmable circuitry of an IC such as an FPGA. The configuration bitstream effectively implements a particular circuit design within the programmable circuitry. The circuit design may specify functional aspects of the programmable circuit blocks and physical connectivity among the various programmable circuit blocks.

In order to write the configuration data into the configuration memory, a hardened write path is typically provided between an external port of the programmable IC and the configuration memory. A hardened read path is typically also provided in order to allow a user of the IC to verify the characteristics of the configuration bitstream. For example, the read path may provide the user a path to read back configuration status registers for identifying the cause of a failed bitstream load. The read path may also be used for high-bandwidth readback at runtime or during emulation and hardward co-simulation applications. However, providing a hardened read path between the configuration memory and the external port may potentially allow for an unauthorized/unwanted user to read out the unencrypted configuration bitstream.

Therefore, what is needed is a mechanism for securing configuration readback in a programmable IC device.

SUMMARY

A programmable integrated circuit is provided. The programmable integrated circuit includes an external port, a configuration memory, a hardened write path between the external port and the configuration memory and a soft read path between the configuration memory and the external port, wherein configuration data stored in the configuration memory is only read through the soft read path.

A programmable integrated circuit is provided. The programmable integrated circuit includes an external port, a configuration memory, a hardened write path between the external port and the configuration memory, a hardened read path between the configuration memory and the external memory and one or more eFuse bits configurable to permanently disable the hardened read path.

A method for providing secure configuration readback to a programmable integrated circuit is provided. The method includes permanently disabling a hardened read path between the configuration memory and the external port and generating a soft read path between the configuration memory and the external port, wherein configuration data stored in the configuration memory is read through the soft read path after the hardened read path is permanently disabled.

Other features will be described in the detailed description.

BRIEF DESCRIPTION OF THE DRAWINGS

The drawings illustrate the design and utility of various features described herein, in which similar elements are referred to by common reference numerals. These drawings are not necessarily drawn to scale. In order to better appreciate how the above-recited and other advantages and objects are obtained, a more particular description will be rendered, which are illustrated in the accompanying drawings. These drawings depict only exemplary features and are not therefore to be considered limiting in the scope of the claims.

DETAILED DESCRIPTION OF THE DRAWINGS

Figure 1:
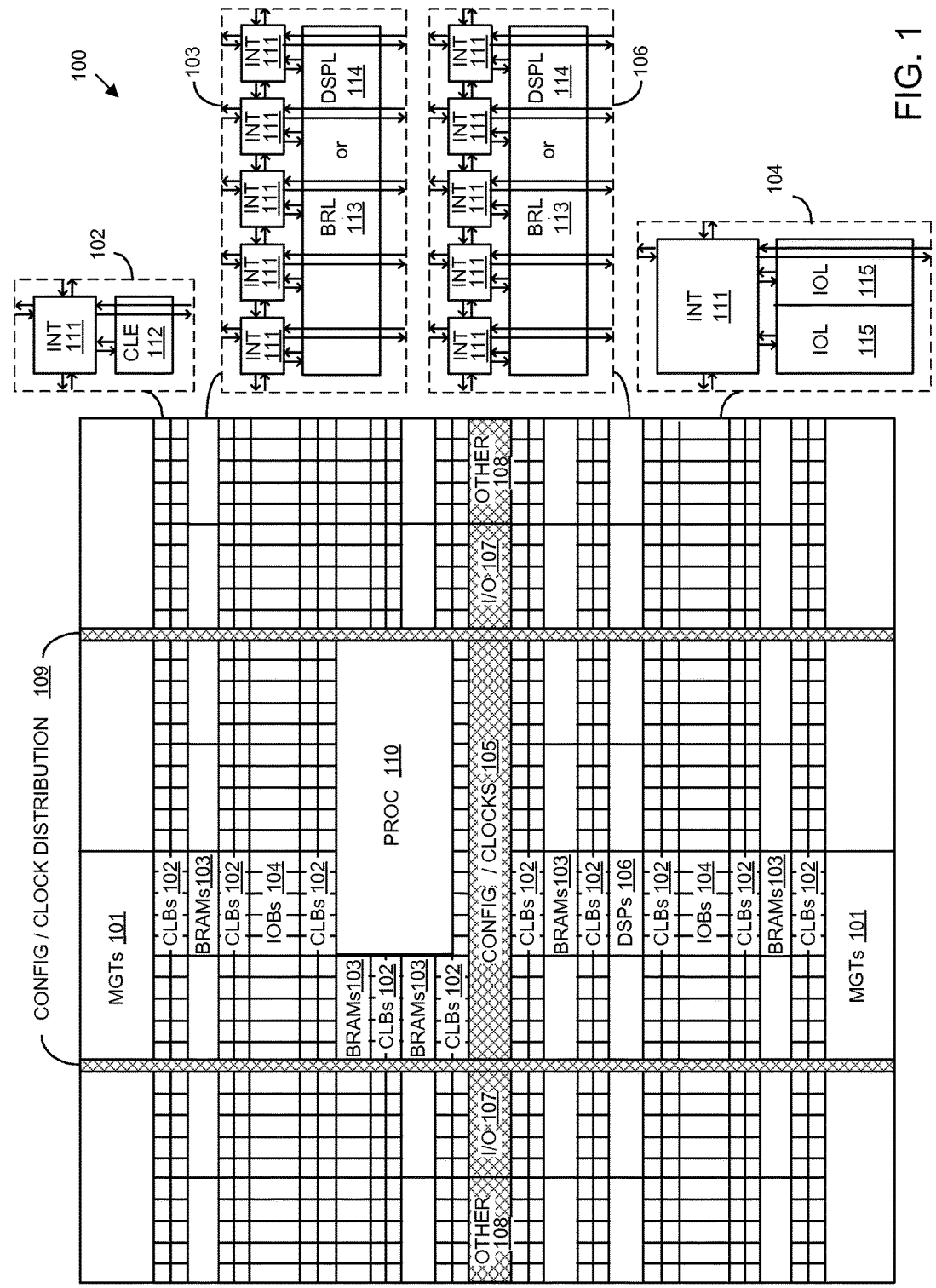
FIG. 1 is a block diagram illustrating an exemplary architecture for an integrated circuit (IC).

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated embodiment need not have all the aspects or advantages shown. An aspect of an advantage described in conjunction with a particular embodiment is not necessarily limited to that embodiment and can be practiced in any other embodiments even if not so illustrated, or if not so explicitly described.

Techniques for securing a read path between a configuration memory and an external port of a programmable integrated circuit are provided.

In one example, a programmable integrated circuit is provided without a hardened read path between the configuration memory and the external port. This prevents unauthorized read access to configuration data stored in the configuration memory. To allow for readback of configuration data, a user may provide readback setup information to the configuration memory for generating a soft read path between the configuration memory and the external port. In some examples, the soft read path may be generated only after the user and/or the readback setup information has been properly authenticated.

In another example, a programmable integrated circuit is provided with a hardened read path between the configuration memory and the external port. One or more eFuse bits in the programmable integrated circuit are configurable to permanently disable the hardened read path. A user is then allowed to upload a configuration bitstream for configuring the design of the programmable integrated circuit (subject to optional authentication/authorization) and also allowed to configure the eFuse bits to permanently disable the hardened read path.

By eliminating the hardened read path between the configuration memory and the external port and/or only allowing for a soft read path to be generated after a user has been authenticated/authorized, unencrypted configuration bitstreams residing in the configuration memory may be protected from unauthorized read access.

FIG. 1 is a block diagram illustrating an exemplary architecture 100 for an IC. In one aspect, architecture 100 is implemented within a programmable IC. For example, architecture 100 may be used to implement a field programmable gate array (FPGA). Architecture 100 is also representative of a system on chip (SoC) type of IC. An SoC is an IC that includes a processor that executes program code and one or more other circuits. The other circuits may be implemented as hardwired circuitry, programmable circuitry, and/or a combination thereof. The circuits may operate cooperatively with one another and/or with the processor.

As shown, architecture 100 includes several different types of programmable circuits, e.g., logic, blocks. For example, architecture 100 may include a large number of different programmable tiles including multi-gigabit transceivers (MGTs) 101, configurable logic blocks (CLBs) 102, random access memory blocks (BRAMs) 103, input/output blocks (IOBs) 104, configuration and clocking logic (CONFIG/CLOCKS) 105 such as an internal configuration access port (ICAP) and the like, digital signal processing blocks (DSPs) 106, specialized I/O blocks 107 (e.g., configuration ports and clock ports), and other programmable logic 108 such as digital clock managers, analog-to-digital converters, system monitoring logic, and so forth.

In some ICs, each programmable tile includes a programmable interconnect element (INT) 111 having standardized connections to and from a corresponding INT 111 in each adjacent tile. Therefore, INTs 111, taken together, implement the programmable interconnect structure for the illustrated IC. Each INT 111 also includes the connections to and from the programmable logic element within the same tile, as shown by the examples included at the top of FIG. 1.

For example, a CLB 102 may include a configurable logic element (CLE) 112 that may be programmed to implement user logic plus a single INT 111. A BRAM 103 may include a BRAM logic element (BRL) 113 in addition to one or more INTs 111. Typically, the number of INTs 111 included in a tile depends on the height of the tile. As pictured, a BRAM tile has the same height as five CLBs, but other numbers (e.g., four) also may be used. A DSP tile 106 may include a DSP logic element (DSPL) 114 in addition to an appropriate number of INTs 111. An 10B 104 may include, for example, two instances of an I/O logic element (IOL) 115 in addition to one instance of an INT 111. As will be clear to those of skill in the art, the actual I/O pads connected, for example, to IOL 115 typically are not confined to the area of IOL 115.

In the example pictured in FIG. 1, a columnar area near the center of the die, e.g., formed of regions 105, 107 and 108, may be used for configuration, clock and other control logic. Horizontal areas 109 extending from this column are used to distribute the clocks and configuration signals across the breadth of the programmable IC.

Some ICs utilizing the architecture illustrated in FIG. 1 include additional logic blocks that disrupt the regular columnar structure making up a large part of the IC. The additional logic blocks may be programmable blocks and/or dedicated circuitry. For example, a processor block depicted as PROC 110 spans several columns of CLBs and BRAMs.

In one aspect, PROC 110 is implemented as a dedicated circuitry, e.g., as a hardwired processor, that is fabricated as part of the die that implements the programmable circuitry of the IC. PROC 110 may represent any of a variety of different processor types and/or systems ranging in complexity from an individual processor, e.g., a single processing core capable of executing program code, to an entire processor system having one or more processing cores, modules, co-processors, interfaces, or the like.

In another aspect, PROC 110 is omitted from architecture 100 and replaced with one or more of the other varieties of the programmable blocks described. Further, such blocks may be utilized to form a "soft processor" in that the various blocks of programmable circuitry maybe used to form a processor that can execute program code as is the case with PROC 110.

The phrase "programmable circuitry" refers to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, circuit blocks shown in FIG. 1 that are external to PROC 110 such as CLBs 102 and BRAMs 103 are considered programmable circuitry of the IC.

In general, the functionality of programmable circuitry is not established until configuration data is loaded into the IC. A set of configuration bits may be used to program programmable circuitry of an IC such as an FPGA. The configuration bit(s) typically are referred to as a "configuration bitstream" or "bitstream". In general, programmable circuitry is not operational or functional without first loading a configuration bitstream into the IC. The configuration bitstream effectively implements a particular circuit design within the programmable circuitry. The circuit design specifies, for example, functional aspects of the programmable circuit blocks and physical connectivity among the various programmable circuit blocks.

Circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 110.

In some instances, hardwired circuitry may have one or more operational modes that can be set or selected according to register settings or values stored in one or more memory elements within the IC. The operational modes may be set, for example, through the loading of a configuration bitstream into the IC. Despite this ability, hardwired circuitry is not considered programmable circuitry as the hardwired circuitry is operable and has a particular function when manufactured as part of the IC.

In the case of an SoC, the configuration bitstream may specify the circuitry that is to be implemented within the programmable circuitry and the program code that is to be executed by PROC 110 or a soft processor. In some cases, architecture 100 includes a dedicated configuration processor that loads the configuration bitstream to the appropriate configuration memory and/or processor memory. The dedicated configuration processor does not execute user-specified program code. In other cases, architecture 100 may utilize PROC 110 to receive the configuration bitstream, load the configuration bitstream into appropriate configuration memory, and/or extract program code for execution.

FIG. 1 is intended to illustrate an exemplary architecture that may be used to implement an IC that includes programmable circuitry, e.g., a programmable fabric. For example, the number of logic blocks in a column, the relative width of the columns, the number and order of the columns, the types of logic blocks included in the columns, the relative sizes of the logic blocks, and the interconnect/logic implementations included at the top of FIG. 1 are purely exemplary. In an actual IC, for example, more than one adjacent column of CLBs is typically included wherever the CLBs appear, to facilitate the efficient implementation of a user circuit design. The number of adjacent CLB columns, however, may vary with the overall size of the IC. Further, the size and/or positioning of blocks such as PROC 110 within the IC are for purposes of illustration only and are not intended as limitation.

Figure 2:
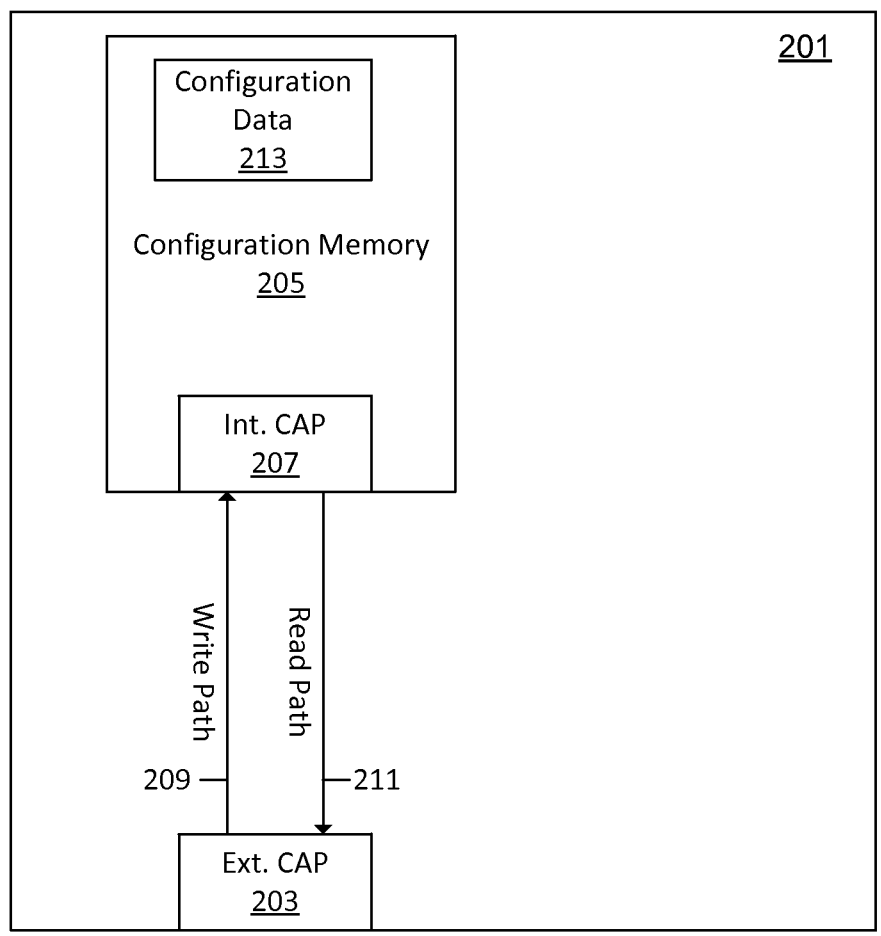
FIG. 2 is a block diagram illustrating an exemplary programmable IC device.

FIG. 2 is a block diagram illustrating an exemplary programmable integrated circuit (IC) device 201. For purposes of simplicity, only certain blocks of the programmable IC device 201 are illustrated, however one ordinarily skilled in the art will recognize that the IC device may include any number of other functional blocks, such as for example, those described above with respect to FIG. 1.

The programmable integrated circuit (IC) device 201 of FIG. 2 includes an external configuration access port (CAP) 203, a configuration memory 205, an internal configuration access port (CAP) 207, a hardened write path 209, a hardened read path 211 and configuration data 213 stored in the configuration memory 205.

As mentioned above, the configuration memory 205 stores configuration data 213 (e.g., unencrypted configuration bitstream) that is utilized to implement the design of the programmable IC 201. The internal CAP 207 provides an interface/port for accessing the contents of the configuration memory 205 from inside the programmable IC 201. The external CAP 203 provides an interface/port for an entity external to the programmable IC 201 to access contents residing within the programmable IC 201, including contents of the configuration memory 205.

A hardened write path 209 is provided between the external CAP 203 and the internal CAP 207. The hardened write path 209 is not programmable and is manufactured as part of the IC 201. The hardened write path 209 allows for an entity (e.g., user) external to the device to write data to the configuration memory 205. For example, a user may write a configuration bitstream 213 to the configuration memory for later programming the programmable IC 201.

A hardened read path 211 is also provided between the external CAP 203 and the internal CAP 207. The hardened read path 209 is also not programmable and is manufactured as part of the IC 201. The hardened read path 209 allows for an entity (e.g., user) external to the device to read data from the configuration memory 205.

The hardened read path 211 provided between the external CAP 203 and the internal CAP 207 is susceptible to attack from an unauthorized user. Because the read path 211 is hardened, a read path permanently exists between the configuration memory 205 and the external port 203, thereby providing a permanent route for an unauthorized user to access configuration data 213. Because the configuration data 213 often contains the highly sensitive information (e.g., unencrypted configuration bitstream for programming IC), providing a mechanism for securing the contents of the configuration memory is of great importance.

One way to eliminate the susceptibility of unauthorized access to configuration data stored in the configuration memory is to manufacture a programmable IC device that does not have a hardened read path between the internal CAP configuration memory and the external port of the programmable IC.

Figure 3A:
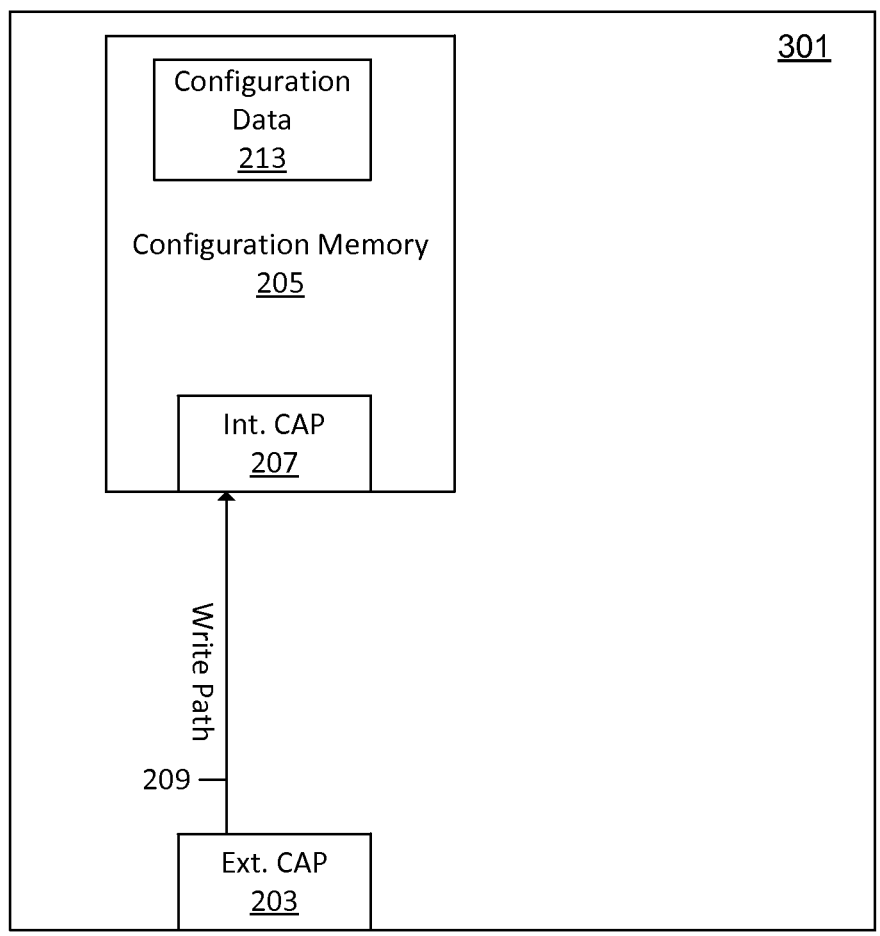
FIG. 3A is a block diagram illustrating an exemplary programmable IC device in accordance with some embodiments.

FIG. 3A is a block diagram illustrating an exemplary programmable IC device in accordance with some embodiments. Much like the programmable IC device 201 described above with respect to FIG. 2, the programmable IC device 301 of FIG. 3 includes an external configuration access port (CAP) 203, a configuration memory 205, an internal configuration access port (CAP) 207, a hardened write path 209 and configuration data 213 stored in the configuration memory 205. However, unlike the programmable IC device 200 in FIG. 2, the programmable IC device 300 in FIG. 3 does not include a hardened read path.

Rather than manufacturing a programmable IC having a hardened read path between the configuration memory 205 and the external CAP 203, the programmable IC 300 of FIG. 3 is instead manufactured without a hardened read path between the configuration memory 205 and the external CAP 203. By doing so, read access to the configuration memory by an unauthorized user may be prevented.

Figure 3B:
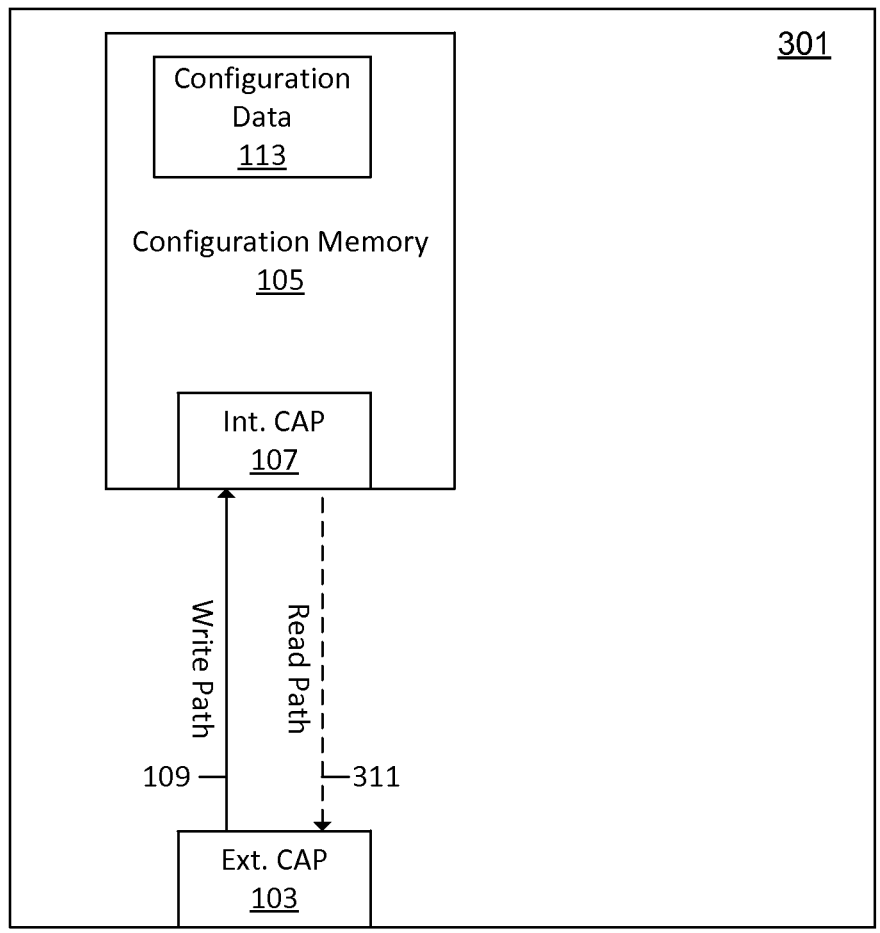
FIG. 3B is a block diagram illustrating the programmable IC device of FIG. 3A configured to have a soft read path in accordance with some embodiments.

Situations may still arise whereby a user needs read access to configuration data stored in the configuration memory. In order to provide read access in the absence of a hardened read path, a soft read path may be created between the internal CAP of the configuration memory and the external CAP of the programmable IC. This is illustrated in FIG. 3B, where a soft read path 311 signified by the dashed arrow is provided between the internal CAP 207 of the configuration memory and the external CAP 203 of the programmable device 301.

The soft read path differs from the hard read path in that it is programmable and not manufactured as a dedicated path in the programmable IC. Additionally, the soft read path may be disabled each time the programmable IC 301 is powered down. The soft read path may be implemented after the manufacture of the programmable IC through the loading of certain readback setup information.

In order to ensure that only an authorized user is able to have access to the soft read path, in some embodiments only an already authorized user may input readback setup information into the configuration memory for generating a soft read path between the configuration memory and the external port. To add an additional layer of protection/security, the actual readback setup information itself may also be authenticated prior to generating the soft read path. The soft read path continues to exist between the configuration memory and the external port while the authorized user is operating the programmable IC, but is disabled when the programmable IC is no longer in use or powered down. Additional details related to the generation of a soft read path will be described below in FIG. 4.

Figure 4:
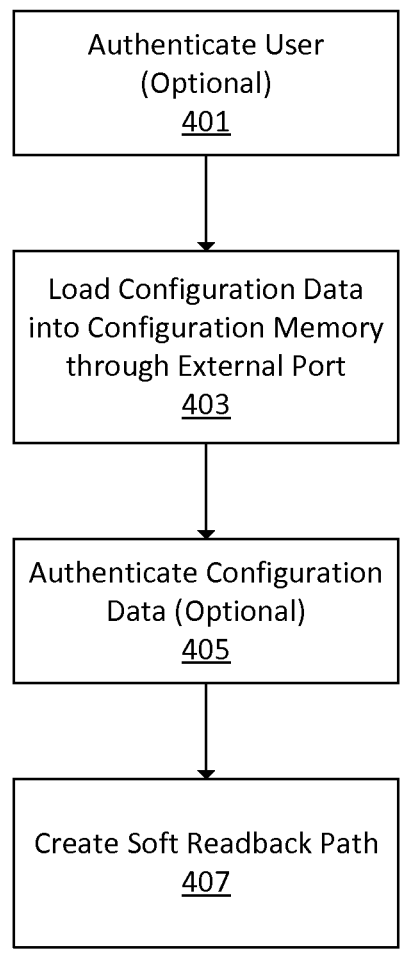
FIG. 4 is a flow diagram illustrating an exemplary method for creating a soft read path in accordance with some embodiments.

FIG. 4 is a flow diagram illustrating an exemplary method for creating a soft read path in accordance with some embodiments. As already described above, the programmable IC is manufactured without a hardened read path in order to prevent unauthorized access to configuration data (e.g., unencrypted bitstream) stored within its configuration memory.

A user may program the programmable IC in accordance with a particular application or function. Before the user is provided write access to the configuration memory for loading a configuration bitstream for configuring the programmable IC, the user may first be optionally authenticated as shown at 401. In some examples, the user may be authenticated using an asymmetric authentication scheme.

The user may then load configuration data (e.g., configuration bitstream) into the configuration memory through an external port of the programmable IC as shown at 403. As mentioned above, the programmable IC is manufactured with a hardened write path between the external CAP of the programmable IC and the internal CAP of the configuration memory. After the user has been authenticated, the user gains access to the configuration memory by way of the hardened write path. The user may then load a configuration bitstream into the configuration memory through the hardened write path, which is subsequently used to program/configure the programmable IC.

A portion of the configuration bitstream loaded into the configuration memory may include readback setup information that is utilized to generate a soft read path between the internal CAP of the configuration memory and the external CAP of the programmable IC.

In order to add an additional layer of protection, the configuration data loaded into the configuration memory by the user may also be authenticated as shown at 405. In some examples, the configuration data may be authenticated using an asymmetric authentication scheme. By authenticating the configuration data prior to generating a soft read path, further assurances are provided as to the legitimacy of the request to generate the soft read path.

A soft read path is then created as shown at 407. The soft read path is created by programming interconnect paths within the programmable IC to provide a read path between the internal CAP of the configuration memory and the external CAP of the programmable IC in accordance with the loaded readback setup information. In some situations, authentication may be enabled and the soft read path may be created only after the user and/or the readback setup information has been authenticated. In other situations, authentication may be disabled, and the soft read path may be created any time configuration data is loaded into configuration memory without first authenticating the user and/or the configuration data.

Generating a soft read path between the external CAP of the programmable IC and the internal CAP of the configuration memory only after user and/or configuration data authentication eliminates the possibility of unauthorized read access to the configuration memory, thereby securing the sensitive information stored within the configuration memory.

An alternative way to eliminate the susceptibility of unauthorized access to configuration data stored in the configuration memory involves providing a mechanism for permanently disabling a hardened read path between the configuration memory and an external port of the programmable IC. Additional details will be provided below with respect to FIGS. 5A-C and FIG. 6.

Figure 5A:
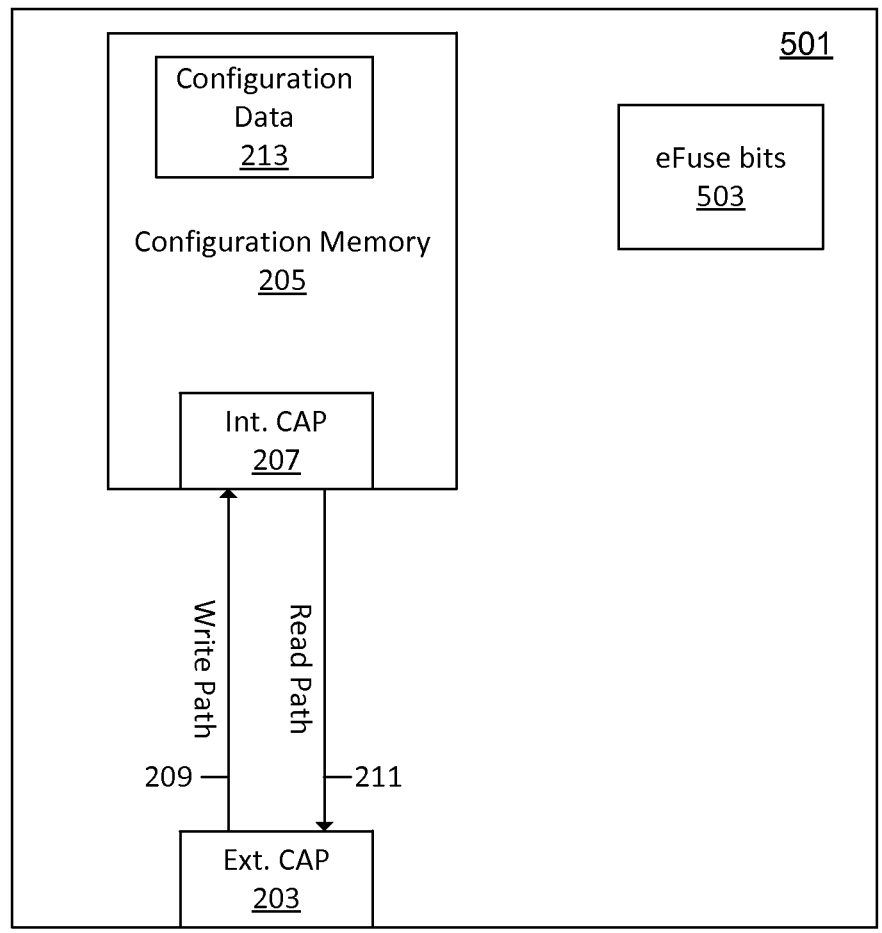
FIG. 5A is a block diagram illustrating an exemplary programmable IC device in accordance with some embodiments.

FIG. 5A is a block diagram illustrating an exemplary programmable IC device in accordance with some embodiments. Much like the programmable IC device 201 described above with respect to FIG. 2, the programmable IC device 501 of FIG. 5A includes an external configuration access port (CAP) 203, a configuration memory 205, an internal configuration access port (CAP) 207, a hardened write path 209, a hardened read path 211 and configuration data 213 stored in the configuration memory 205. However, unlike the programmable IC device 201 in FIG. 2, the programmable IC device 501 in FIG. 5A also includes a set of eFuse bits 503 configurable to permanently disable the hardened read path 211.

The eFuse bits 503 may be configured by a user to permanently disable the hardened read path 211 between the internal CAP 207 of the configuration memory 205 and the external CAP 203 of the programmable IC 501. In some situations, redundant eFuse bits may be used in order to provide higher security/reliability.

Figure 5B:
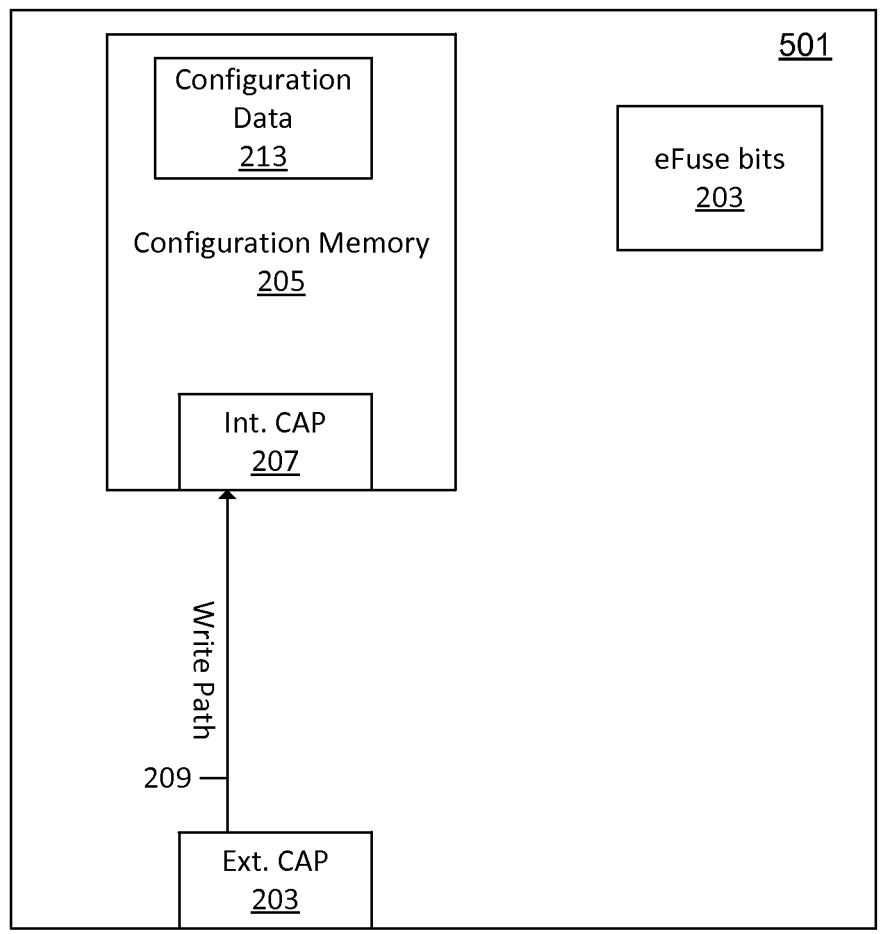
FIG. 5B is a block diagram illustrating the programmable IC device of FIG. 5A configured to have a permanently disabled hard read path in accordance with some embodiments.

Once the eFuse bits 503 have been blown the hardened read path 211 between the internal CAP 207 of the configuration memory 205 and the external CAP 203 of the programmable IC 501 is permanently disabled as illustrated in FIG. 5B. By permanently disabling the hardened read path 211, read access to the configuration memory by an unauthorized user may be prevented.

Figure 5C:
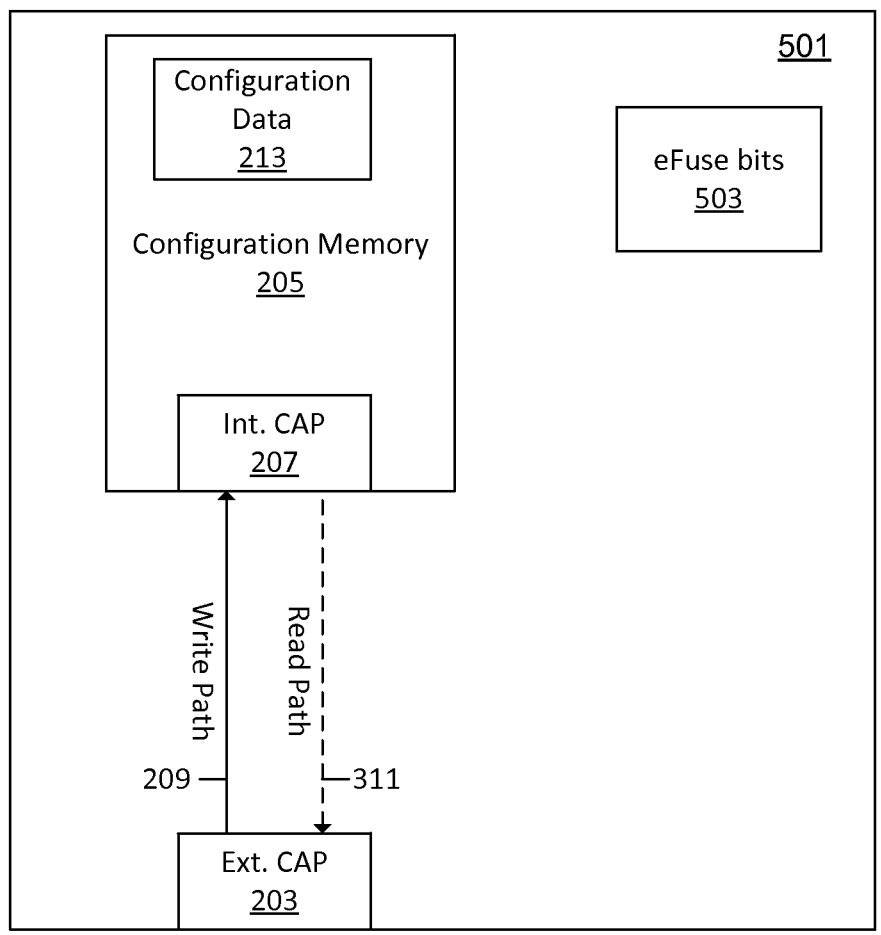
FIG. 5C is a block diagram illustrating the programmable IC device of FIG. 5A configured to have a soft read path in accordance with some embodiments.

Situations may still arise whereby a user needs read access to configuration data stored in the configuration memory. In order to provide read access in the absence of a hardened read path, a soft read path may be created between the internal CAP of the configuration memory and the external CAP of the programmable IC in the same manner as described above with respect to FIG. 4. This is illustrated in FIG. 5C, where a soft read path 311 signified by the dashed arrow is provided between the internal CAP 207 of the configuration memory and the external CAP 203 of the programmable device 501.

As mentioned above, the soft read path differs from the hard read path in that it is programmable and not manufactured as a dedicated path in the programmable IC. Additionally, the soft read path may be disabled each time the programmable IC is powered down. The soft read path may be implemented after the manufacture of the programmable IC through the loading of certain readback setup information.

In order to ensure that only an authorized user is able to have access to the soft read path, in some embodiments only an already authorized user may input readback setup information into the configuration memory for generating a soft read path between the configuration memory and the external port. To add an additional layer of protection/security, the actual readback setup information itself may also be authenticated prior to generating the soft read path. The soft read path continues to exist between the configuration memory and the external port while the authorized user is operating the programmable IC, but is disabled when the programmable IC is no longer in use or powered down.

Figure 6:
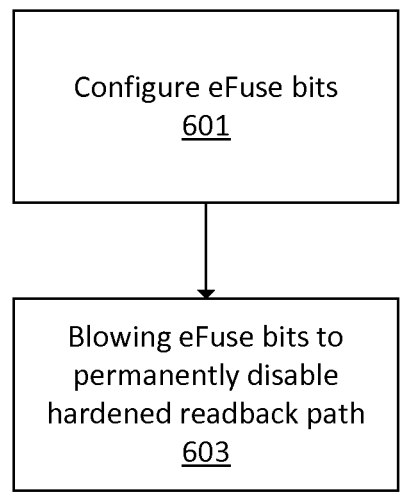
FIG. 6 is a flow diagram illustrating an exemplary method for permanently disabling a hardened read path in accordance with some embodiments.

FIG. 6 is a flow diagram illustrating an exemplary method for permanently disabling a hardened read path in accordance with some embodiments. FIG. 6 describes the process of permanently disabling a hardened read path using eFuse bits and subsequently generating a soft read path.

A user may be provided a programmable IC having a hardened read path. The programmable IC having a hardened read path may be similar to the programmable IC described above with respect to FIG. 5A.

In order to subsequently disable the hardened read path, the user may initialize the eFuse bits to subsequently permanently disable the hardened read path as shown at 601. For example, the eFUse bits may be initialized such that the enable control of a data buffer may initially be driven by the eFuse bits.

The eFuse bits may then be blown to permanently disable the hardened read path as shown at 603. For example, once the eFuse bits are blown they may permanently drive the enable pins on the buffer to an opposite state such that the buffer is effectively turned off, thereby causing the hardened read path to be permanently disabled.

After the hardened read path has been permanently disabled, a soft readback path may be optionally created in the manner described above with respect to FIG. 4.

Thus, what has been described are techniques for securing a read path between a configuration memory and an external port of a programmable integrated circuit are provided.

Although particular features have been shown and described, it will be understood that they are not intended to limit the claimed invention, and it will be made obvious to those skilled in the art that various changes and modifications may be made without departing from the spirit and scope of the claimed invention. The specification and drawings are, accordingly to be regarded in an illustrative rather than restrictive sense. The claimed invention is intended to cover all alternatives, modifications and equivalents.

What is claimed is:

1. A programmable integrated circuit, comprising:
  an external port;
  a configuration memory;
  programmable logic including programmable interconnect paths, the programmable logic configured to be programmed in response to configuration data stored in the configuration memory;
  a hardened write path between the external port and the configuration memory; and
  a soft read path between the configuration memory and the external port, the soft read path including at least some of the programmable interconnect paths from the programmable logic, wherein configuration data stored in the configuration memory is only read through the soft read path.

2. The programmable integrated circuit of claim 1, wherein the soft read path between the configuration memory and the external port is created in response to readback setup information written into the configuration memory through the hardened write path.

3. The programmable integrated circuit of claim 2, wherein a user is first authenticated before being permitted to write the readback setup information into the configuration memory through the hardened write path.

4. The programmable integrated circuit of claim 2, wherein the soft read path is created only after the readback setup information written into the configuration memory is authenticated.

5. The programmable integrated circuit of claim 4, wherein the readback setup information is written into the configuration memory along with design information for programming the programmable integrated circuit.

6. The programmable integrated circuit of claim 1, wherein the configuration memory includes an unencrypted bitstream.

7. The programmable integrated circuit of claim 1, wherein the soft read path between the configuration memory and the external port replaces a need for having a hardened read path between the configuration memory and the external port.

8. The programmable integrated circuit of claim 1, wherein the soft read path is situated between an internal access port of the configuration memory and the external port.

9. A programmable integrated circuit, comprising:
  an external port;
  a configuration memory;
  a hardened write path between the external port and the configuration memory;
  a hardened read path between the configuration memory and the external port; and
  one or more eFuse bits configurable to permanently disable the hardened read path.

10. The programmable integrated circuit of claim 9, further comprising a soft read path between the configuration memory and the external port to replace the permanently disabled hardened read path.

11. The programmable integrated circuit of claim 10, wherein the soft read path between the configuration memory and the external port is created in response to readback setup information written into the configuration memory through the hardened write path.

12. The programmable integrated circuit of claim 11, wherein a user is first authenticated before being permitted to write the readback setup information into the configuration memory through the hardened write path.

13. The programmable integrated circuit of claim 11, wherein the soft read path is created only after the readback setup information written into the configuration memory is authenticated.

14. The programmable integrated circuit of claim 10, wherein configuration data stored in the configuration memory can only be read through the soft read path after the hardened read path is permanently disabled.

15. The programmable integrated circuit of claim 10, wherein a user is first authenticated before being permitted to configure the one or more eFuse bits to permanently disable the hardened read path.

16. A method for providing secure configuration read to a configuration memory connected to programmable logic within a programmable integrated circuit, comprising:
  permanently disabling a hardened read path between the configuration memory and an external port; and
  generating, by programming interconnections within the programmable logic, a soft read path between the configuration memory and the external port, wherein configuration data stored in the configuration memory is only read through the soft read path after the hardened read path is permanently disabled.

17. The method of claim 16, wherein permanently disabling the hardened read path between the configuration memory and the external port comprises configuring one or more eFuse bits of the programmable integrated circuit.

18. The method of claim 16, wherein the soft read path between the configuration memory and the external port is created in response to readback setup information written into the configuration memory through a hardened write path between the external port and the configuration memory.

19. The method of claim 18, wherein a user is first authenticated before being permitted to write the readback setup information into the configuration memory through the hardened write path.

20. The method of claim 18, wherein the soft read path is created only after the readback setup information written into the configuration memory is authenticated.

* * * * *